United States Patent [19]

Sang et al.

[11] Patent Number: 5,270,237

[45] Date of Patent: Dec. 14, 1993

[54] METHOD FOR MANUFACTURING MASK ROMS BY USING A PROTECTION LAYER

[75] Inventors: Jae H. Sang; Young J. Kwon, Seoul; Jun K. Bae; Kun O. Ahn, both of Suweon, all of Rep. of Korea

[73] Assignee: Samsung Electronics Co., Ltd., Suweon, Rep. of Korea

[21] Appl. No.: 872,609

[22] Filed: Apr. 23, 1992

[30] Foreign Application Priority Data

Aug. 24, 1991 [KR] Rep. of Korea ............ 91-14795

[51] Int. Cl.[5] .................................. H01L 21/266
[52] U.S. Cl. ................................ 437/52; 437/45; 437/978
[58] Field of Search .............. 437/41, 42, 43, 45, 437/52, 61, 978; 148/DIG. 43

[56] References Cited

U.S. PATENT DOCUMENTS

| | | | |
|---|---|---|---|
| 4,356,042 | 10/1982 | Gedaly et al. | 437/45 |
| 4,466,172 | 8/1984 | Batra | 437/42 |
| 5,013,674 | 5/1991 | Bergemont | 437/52 |

FOREIGN PATENT DOCUMENTS 0111161 8/1980 Japan .................................. 437/43

OTHER PUBLICATIONS

Wolf et al., "Silicon Processing for the VLSI Era", pp. 514-520, 1986.

Primary Examiner—Brian E. Hearn
Assistant Examiner—C. Chaudhari
Attorney, Agent, or Firm—Ladas & Parry

[57] ABSTRACT

A method for manufacturing mask ROMs is disclosed, wherein a semiconductor substrate of a first conductive type, on which a gate insulating layer, a poly-silicon layer, source and drain regions and a spacer are formed is stored after depositing the entire surface of the structure with a protection layer until the next steps such as programming, so that the poly-silicon gate and the source and drain regions of the structure can be prevented from being polluted with organisms or matriums, etc. by forming a protection layer before the storage, thereby improving the efficiency and reliability of mask ROMs, and the ROM data region can be checked during the etching of the protecting layer for distinguishing the defective chips simply and efficiently in a short manufacturing time.

3 Claims, 2 Drawing Sheets

METHOD FOR MANUFACTURING MASK ROMS BY USING A PROTECTION LAYER

FIELD OF THE INVENTION

The present invention relates to a method for manufacturing mask ROMs, and particularly to a programming process of mask ROMs, whereby the structure can be prevented from being polluted during the entire process of program ROM data storage, and the manufacturing time can be shortened.

BACKGROUND OF THE INVENTION

Mask ROMs, a kind of nonvolatile memory, is the device which a variation is impossible after the fixation of data at a stage of manufacture, and is utilized in the use of ROM for a character font of CRT display or printer, and in the use of data programming directed by a user.

Mask ROMs has a simple memory cell structure so that it has higher integration density than any other semiconductor memory, and a large amount of ROMs of the same data ordered by a user can be manufactured at the same time so that the cost is reduced, so it is widely used.

FIGS. 1A to 1D are cross-sectional views showing manufacturing process of masks ROMs according to the conventional technique.

Referring to FIG. 1A, a gate insulating layer 3 and a poly-silicon gate 5 are first formed on a P-type silicon semiconductor substrate 1 by the known method, and then N-type impurity ions, such as phosphorous and arsenic, opposed to the substrate 1 are injected into the substrate 1 to form a first ion implantation layer 7.

Referring to FIG. 1B, after the formation of a spacer 11 on the sidewall of the poly-silicon gate 5 by the known method, ions of the first ion implantation layer 7 is activated by means of a thermal treatment so as to form source and drain regions 8 and 9. subsequently, N-type impurities, such as phosphorous and arsenic, are injected through the entire surface of the structure so as to form a second implantation layer for the ohmic contact between the source and drain regions 8 and 9 and metal lines. Ions of the second ion implantation layer is next activated by means of a thermal treatment so as to form source and drain diffusion regions 13 and 15.

At this time, it should be noted that the energy of the activated ions is so suitably controlled as not to pass through the source and drain regions 8 and 9.

The substrate 1 with the abovesaid components is stored in an ambient state of N$_2$ or a vacuum state container until the following steps being performed according to the desired program.

Referring to FIG. 1C, if desired, programming is performed on the stored substrate 1 according to the desired program. After forming a photoresist layer pattern 16 by the known photo- lithography method to expose a programming region 14, P-type impurity ions are injected in high energy enough to pass through the poly-silicon gate 5 of the programming region 14 and the gate insulating layer 3 so as to form a third ion implantation layer 17.

The impurity ions injected into parts except for the lower part of the gate insulating layer 3 don't affect the junction because passing through the exposed source and the drain regions 8 and 9 of the programming region 14 due to high energy.

Referring to FIG. 1D, after the removal of the photoresist layer pattern 16, a protection layer 19 and metal interconnections are formed by the known method, and then a passivation layer 21 is formed of glass insulating material, such as BPSG(Boro-Phospho Silicate Glass), PSG(Phospho Silicate Glass), USG(Undoped Silicate Glass), on the entire surface of the structure. At this time, the thermal energy occurred during the abovedescribed processes activates the third ion implantation layer 17 so as to form a channel region 18 under the gate insulating layer 3.

Thus, in the manufacturing method of mask ROMs according to the above described conventional technique, the silicon semiconductor substrate on which the gate insulating layer, the source and drain regions, and the source and drain diffusion regions are formed is stored until the step, such as programming, being performed according to the desired program.

Accordingly, there are occured some problems that the poly-silicon gate and the source and drain regions of the structure can be polluted by organisms or natrium, etc. as they are exposed to air during the long time storage, and the manufacturing time is prolonged. Further, the efficiency and reliability of mask ROMs are degraded because the following steps, for example, programming, are performed by using the polluted substrate.

Moreover, the identification of a program takes much time because it is impossible to check the program during programming so that the final mask ROMs is inspected for checking defective chips.

SUMMARY OF THE INVENTION

An object of the present invention is to provide a method for manufacturing mask ROMs, whereby the structure can be prevented from being polluted during the entire process of program ROM data storage, and the manufacturing time can be shortened, and consequently, the efficiency and reliability of Mask ROMs manufactured are improved.

Another object of the present invention is to provide a method for manufacturing mask ROMs in which it is possible to identify the program during programming so as to check defective chips simply and efficiently.

A method for manufacturing mask ROMs according to the present invention comprises the steps of forming a gate insulating layer and a poly-silicon gate on a semiconductor substrate of a first conductive type, forming a first ion implantation layer by injecting impurity ions of a second conductive type on the entire surface of the structure, forming a spacer on the sidewall of the polysilicon gate after activating the ions of the first ion implantation layer by means of a thermal treatment so as to form source and drain regions, forming a second ion implantation layer by injecting impurity ions of the second conductive type into the source and drain regions, forming a protection layer on the entire surface of the structure after activating the ions of the second ion implantation layer so as to form source and drain diffusion regions, removing the exposed protection layer after forming a photoresist layer pattern so as to expose a programming region, forming a third ion implantation layer by injecting the impurity ions of the first conductive type into the substrate under the gate insulating layer, forming a passivation layer on the entire surface of the structure after forming a channel region by activating the ions of the third ion implantation.

Other objects and features of the present invention will become apparent from a consideration of the following description which proceeds with reference to the accompanying drawings in which selected example embodiments are illustrated by way of example, and not by way of limitation.

DETAILED DESCRIPTION OF THE PREFERRED EMBODIMENT

Figure 1A:
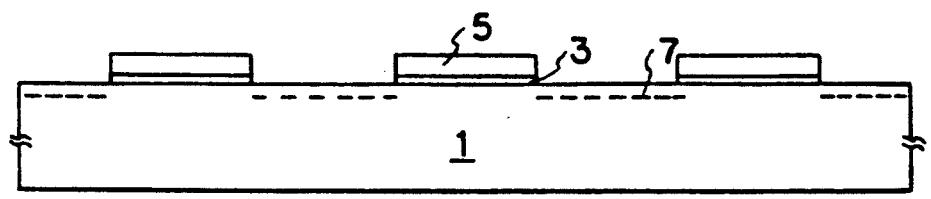
FIGS. 1A to 1D are cross-sectional views showing a manufacturing process of mask ROMs according to a conventional technique.
Figure 1B:
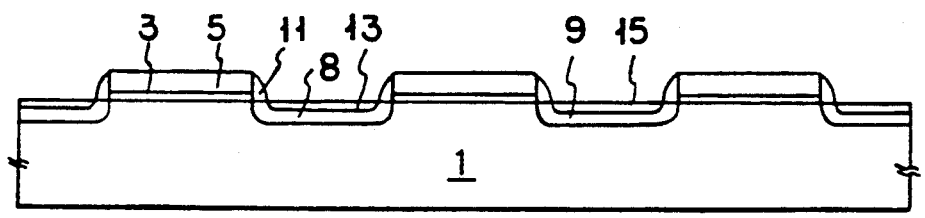
Figure 1C:
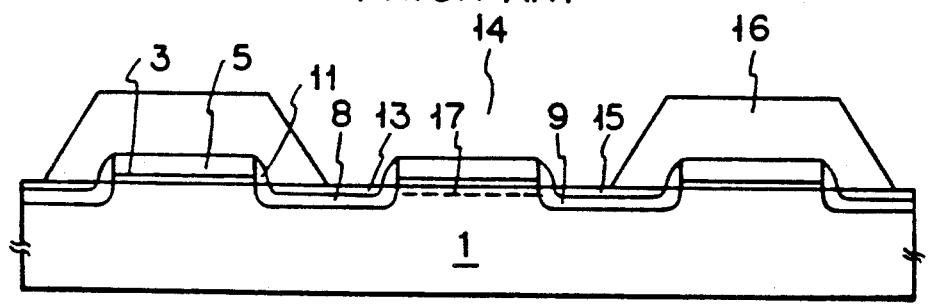
Figure 1D:
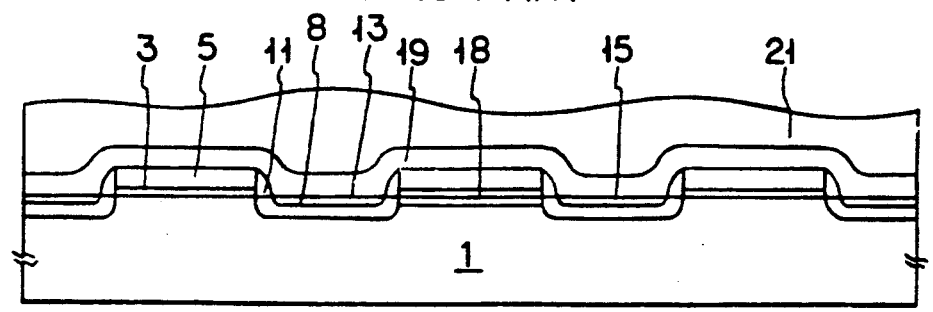
Figure 2A:
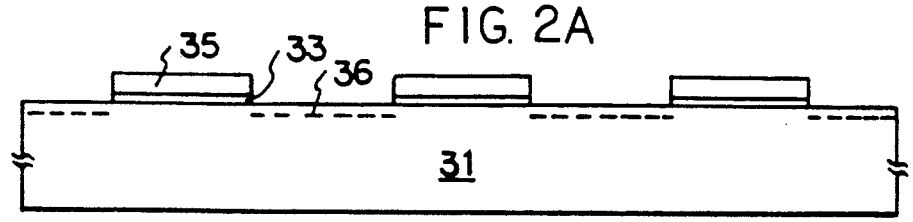
FIGS. 2A to 2E are cross-sectional views showing a manufacturing process of mask ROMs according to the present invention.

Referring to FIG. 2A, a gate insulating layer 33 and a poly-silicon gate 35 are first formed on a P-type silicon substrate 31 by the known method, and then by utilizing the poly-silicon gate 35 as an implantation mask, N-type impurity ions, such as phosphorous and arsenic, are injected into the substrate 31 to form a first ion implantation layer 36.

Figure 2B:
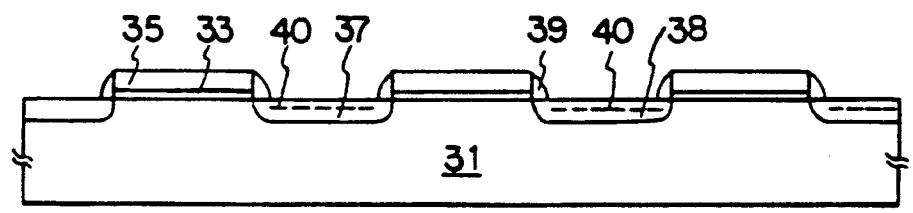

Referring to FIG. 2B, after the formation of a spacer 39 on the sidewall of the poly-silicon gate 35 by the known method, the first ion implantation layer 36 is activated by means of a thermal treatment so as to form source and drain regions 37 and 38. At this time, the source and drain regions 37 and 38 may be formed by 0.3 to 0.4 $\mu$m in depth under the upper surface of the substrate 31.

Subsequently, by utilizing the poly-silicon gate 35 and the spacer 39 as a implantation mask, N-type impurity ions, such as phosphorous and arsenic, are injected into the upper part of the source and drain regions 37 and 38 so as to form a second implantation layer 40 for the ohmic contact between the source and drain regions 37 and 38 and metal lines.

Figure 2C:
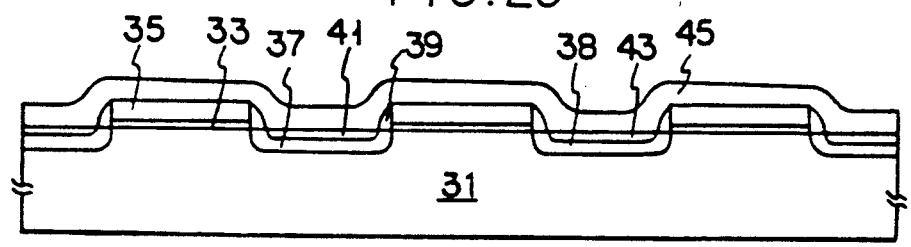

Referring to FIG. 2C, a protection layer 45 is formed in silicon oxide or silicon nitride on the entire surface of the structure by the Chemical Vapor Deposition (hereinafter termed "CVD"). The second ion implantation layer 40 is next activated by means of a thermal treatment so as to form source and drain diffusion regions 41 and 43 by about 0.2 $\mu$m in depth in the upper part of the source and drain regions 37 and 38 for the ohmic contact with the metal lines.

The protection layer 45 protects the structure of the semiconductor substrate 31 from a pollution by organisms or natriums, etc. during the storage.

The substrate 31 with the source and drain diffusion regions 41 and 43 and the protection layer 45 is stored in an ambient state of $N_2$ or a vacuum state container until the following steps being performed according to the desired program.

Figure 2D:
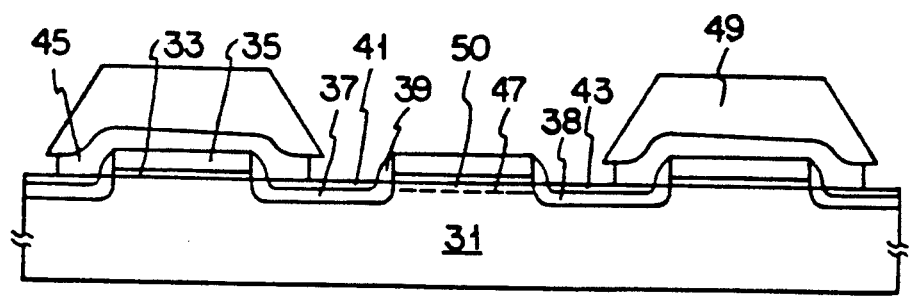

Referring to FIG. 2D, if desired program, programming is performed on the stored substrate 31 according to the desired program, and after forming a photoresist layer pattern 49 at a predetermined part of the protection layer 45 by the known photo- lithography method to expose a programming region 50, the exposed protection layer 45 is removed by the dry or wet etching. A third ion implantation layer 47 is next formed by injecting P-type impurity ions, such as boron, under the gate insulating layer 33.

At this time, the P-type impurity ions injected into the parts except for the part of the substrate 31 under the poly-silicon gate 35 is injected to lower part of the substrate 31 through the source and drain regions 37 and 38 so as not to affect the electrical conductivity of the semiconductor device.

Figure 2E:
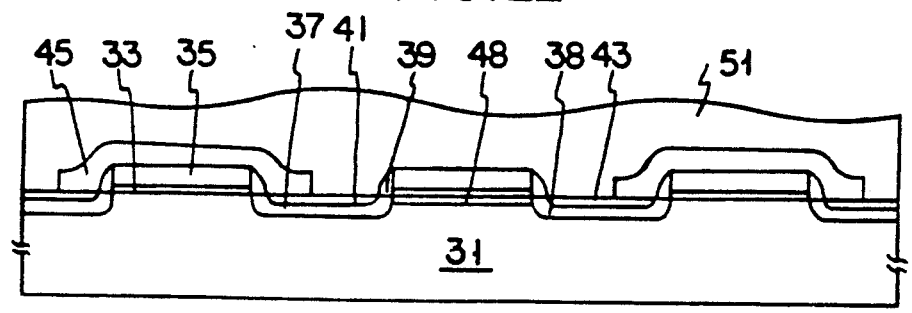

Referring to FIG. 2E, after the removal of the photoresist layer pattern 49, the third ion implantation layer 47 under the gate insulating layer 33 is activated by a thermal treatment so as to form a channel region 48, and then a passivation layer 51 is formed of glass insulating material, such as BPSG, PSG OR USG, on the entire surface of the structure.

Thus, in the manufacturing method of mask ROMs according to the present invention, a semiconductor substrate of a first conductive type, on which a gate insulating layer, a poly-silicon layer, source and drain regions and a spacer are formed is stored after depositing the entire surface of the structure with a protection layer until the next steps, such as programming, being performed according to the desired program, thereafter a channel region and a passivation layer being formed.

Accordingly, according to the present invention, the poly-silicon gate and the source and drain regions of the structure can be prevented from being polluted with organisms or natriums, etc. by way of a protection layer because the formation of the protection layer precedes the storage, thereby improving the efficiency and reliability of mask ROMs.

Further, the method according to the present invention enables to check ROM data region during etching the protection layer so as to take out defective chips simply and efficiently, and to shorten a manufacturing time because the formation of the protection layer precedes the storage.

What is claimed is:

1. A method for manufacturing mask ROMs comprising the steps of:
    forming a plurality of spaced apart structures each comprising a gate insulating layer and an overlying poly-silicon gate on a surface of a semiconductor substrate of a first conductivity type;
    forming first ion implanted regions by injecting impurity ions of a second conductivity type into portions of said substrate adjoining said structures;
    activating the ions of said first ion implanted regions by means of a thermal treatment so as to form source and drain regions adjoining each of said structures;
    then forming a continuous protection layer on said surface and directly onto the poly-silicon gates of said structures;
    patterning said protection layer so as to directly expose selected ones only of said poly-silicon gates;
    forming second ion implanted regions by injecting impurity ions of said first conductivity type into said substrate only through said selected and exposed poly-silicon gates; and
    forming a passivation layer on said surface after forming channel regions underlying said selected structures by activating said ions of said second ion implanted regions.

2. The method of claim 1, comprising, after forming said protection layer and prior to patterning said protection layer, storing said substrate in an inert atmosphere.

3. A process of manufacturing a programmed memory device comprising providing a programmable structure comprising a semiconductor substrate containing a plurality of spaced apart, field effect transistors each comprising source and drain regions formed at a surface of said substrate and separated by a channel region covered by a gate insulating layer covered by a gate electrode, then covering the entire said surface and said layers and gate electrodes thereon with a continuous protective layer with said protective layer directly contacting said gate electrodes, then storing said protective layered structure in an inert atmosphere, and, after said storage step, programming said structure by patterning said protective layer to directly expose the gate electrodes of selected ones only of said transistors, and further processing only said selected transistors by injecting ions into said substrate through said exposed gate electrodes.

* * * * *